United States Patent
Choi et al.

(10) Patent No.: US 11,710,728 B2
(45) Date of Patent: Jul. 25, 2023

(54) MEMORY DEVICE HAVING WAFER-TO-WAFER BONDING STRUCTURE

(71) Applicant: SK hynix Inc., Icheon-si (KR)

(72) Inventors: Je Hyun Choi, Icheon-si (KR); Sung Lae Oh, Icheon-si (KR); Soo Yeol Chai, Icheon-si (KR)

(73) Assignee: SK hynix Inc., Icheon-si (KR)

(*) Notice: Subject to any disclaimer, the term of this patent is extended or adjusted under 35 U.S.C. 154(b) by 33 days.

(21) Appl. No.: 17/178,001

(22) Filed: Feb. 17, 2021

(65) Prior Publication Data
US 2022/0139895 A1 May 5, 2022

(30) Foreign Application Priority Data
Oct. 30, 2020 (KR) .......................... 10-2020-0142698

(51) Int. Cl.
| | |
|---|---|
| G11C 16/04 | (2006.01) |
| H01L 25/18 | (2023.01) |
| H01L 23/00 | (2006.01) |
| G11C 16/30 | (2006.01) |
| G11C 16/24 | (2006.01) |
| H10B 41/35 | (2023.01) |
| H10B 41/41 | (2023.01) |
| H10B 43/35 | (2023.01) |
| H10B 43/40 | (2023.01) |
| G11C 7/10 | (2006.01) |
| G11C 16/08 | (2006.01) |

(52) U.S. Cl.
CPC .......... *H01L 25/18* (2013.01); *G11C 16/0483* (2013.01); *G11C 16/24* (2013.01); *G11C 16/30* (2013.01); *H01L 24/05* (2013.01); *H01L 24/20* (2013.01); *H10B 41/35* (2023.02); *H10B 41/41* (2023.02); *H10B 43/35* (2023.02); *H10B 43/40* (2023.02); *G11C 7/1039* (2013.01); *G11C 16/08* (2013.01); *H01L 2924/1431* (2013.01); *H01L 2924/1438* (2013.01)

(58) Field of Classification Search
CPC ...... G11C 16/0483; G11C 16/24; G11C 16/30
USPC .................................................... 365/185.13
See application file for complete search history.

(56) References Cited

U.S. PATENT DOCUMENTS

| | | | | |
|---|---|---|---|---|
| 8,879,351 | B2* | 11/2014 | Kim ...................... | G11C 7/1033 365/174 |
| 9,165,654 | B1* | 10/2015 | Oh ......................... | G11C 16/06 |
| 10,672,479 | B2* | 6/2020 | Kim ....................... | G11C 16/08 |

(Continued)

FOREIGN PATENT DOCUMENTS

KR 1020060016553 A 2/2006

*Primary Examiner* — Tha-O H Bui

(57) ABSTRACT

A memory device includes a cell wafer having a first pad on one surface thereof; and a peripheral wafer bonded to the one surface of the cell wafer, and having a second pad coupled to the first pad. The cell wafer includes a memory cell array; first and second bit lines coupled to the memory cell array; and a bit line selection circuit configured to couple one of the first and second bit lines to the first pad. The peripheral wafer includes a page buffer low-voltage circuit including a first page buffer low-voltage unit corresponding to the first bit line and a second page buffer low-voltage unit corresponding to the second bit line; and a page buffer high-voltage circuit configured to couple one of the first and second page buffer low-voltage units to the second pad.

20 Claims, 12 Drawing Sheets

(56) References Cited

U.S. PATENT DOCUMENTS

| | | | |
|---|---|---|---|
| 2015/0009757 A1* | 1/2015 | Hu | H10B 43/10 |
| | | | 365/185.05 |
| 2019/0081069 A1 | 3/2019 | Lu et al. | |
| 2020/0160910 A1* | 5/2020 | Hsu | G11C 16/32 |

* cited by examiner

MEMORY DEVICE HAVING WAFER-TO-WAFER BONDING STRUCTURE

CROSS-REFERENCE TO RELATED APPLICATION

The present application claims priority under 35 U.S.C. § 119(a) to Korean Patent Application No. 10-2020-0142698 filed in the Korean Intellectual Property Office on Oct. 30, 2020, which is incorporated herein by reference in its entirety.

BACKGROUND

1. Technical Field

Various embodiments generally relate to a semiconductor technology, and particularly, to a memory device which has a wafer-to-wafer bonding structure.

2. Related Art

As the demand for portable phones, mobile memory devices and digital cameras increases, the demand for non-volatile memory devices that are mainly used as memory devices for these products is also increasing. Among non-volatile memory devices, a NAND flash memory device is being widely used as a data storage device.

Recently, as measures for achieving the large capacity and high performance of a memory device, a structure has been proposed, in which components included in the memory device are fabricated on not a single wafer, but instead on at least two wafers and then the wafers are bonded to each other to couple the components.

SUMMARY

Various embodiments are directed to reducing a failure of a memory device and reducing the size thereof.

In an embodiment, a memory device may include: a cell wafer having a first pad on one surface thereof; and a peripheral wafer bonded to the one surface of the cell wafer, and having a second pad coupled to the first pad. The cell wafer may include: a memory cell array; a first bit line and a second bit line coupled to the memory cell array; and a bit line selection circuit configured to couple one of the first bit line and the second bit line to the first pad. The peripheral wafer may include: a page buffer low-voltage circuit including a first page buffer low-voltage unit corresponding to the first bit line and a second page buffer low-voltage unit corresponding to the second bit line; and a page buffer high-voltage circuit configured to couple one of the first page buffer low-voltage unit and the second page buffer low-voltage unit to the second pad.

In an embodiment, a memory device may include: a cell wafer having a plurality of first pads on one surface thereof; and a peripheral wafer bonded to the one surface of the cell wafer, and having a plurality of second pads that are coupled to the plurality of first pads. The cell wafer may include: a memory cell array; a plurality of bit lines, coupled to the memory cell array, that includes a plurality of first bit lines and a plurality of second bit lines; and a bit line selection circuit configured to couple the plurality of first bit lines or the plurality of second bit lines to the plurality of first pads. The peripheral wafer may include: a page buffer low-voltage circuit including a plurality of first page buffer low-voltage units corresponding to the plurality of first bit lines and a plurality of second page buffer low-voltage units corresponding to the plurality of second bit lines; and a page buffer high-voltage circuit configured to couple the plurality of first page buffer low-voltage units or the plurality of second page buffer low-voltage units to the plurality of second pads.

In an embodiment, a memory device may include: a memory cell array; and a page buffer circuit coupled to the memory cell array through a first bit line and a second bit line. The page buffer circuit may include: a bit line selection circuit provided in a cell wafer that includes the memory cell array and that has a first pad on one surface thereof, and configured to couple one of the first bit line and the second bit line to the first pad; a page buffer low-voltage circuit, provided in a peripheral wafer that is bonded to the one surface of the cell wafer and has, on one surface thereof bonded to the cell wafer a second pad coupled to the first pad, that includes a first page buffer low-voltage unit corresponding to the first bit line and a second page buffer low-voltage unit corresponding to the second bit line; and a page buffer high-voltage circuit provided in the peripheral wafer, and configured to couple one of the first page buffer low-voltage unit and the second page buffer low-voltage unit to the second pad.

DETAILED DESCRIPTION

Figure 1:
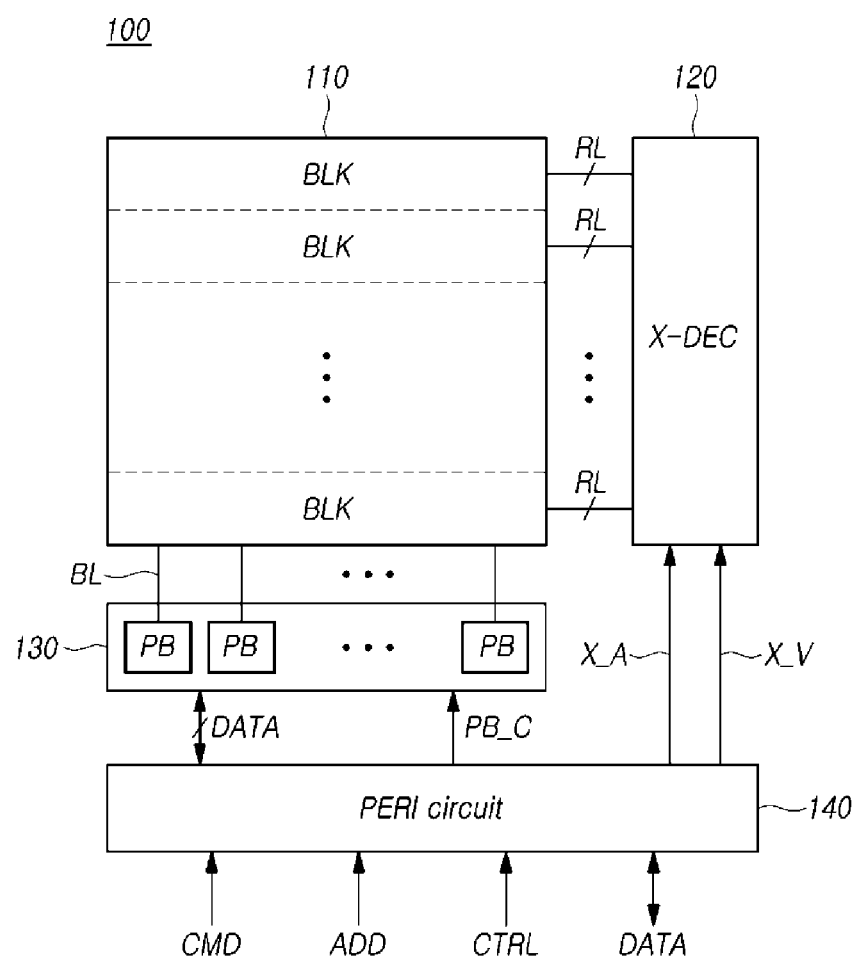
FIG. 1 is a block diagram illustrating a memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

Because the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article (e.g., "a," "an" or "the") is used when referring to a singular noun, the article may include a plural of that noun unless specifically stated otherwise.

In interpreting elements in embodiments of the disclosure, they should be interpreted as including error margins even in the absence of explicit statements.

Also, in describing the components of the disclosure, there may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram illustrating a memory device in accordance with an embodiment of the disclosure.

Referring to FIG. 1, a memory device 100 in accordance with an embodiment of the disclosure may include a memory cell array 110 and a logic circuit for controlling the memory cell array 110. The logic circuit may include a row decoder (X-DEC) 120, a page buffer circuit 130 and a peripheral circuit (PERI circuit) 140.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor, which are coupled in series. Each memory cell may be a volatile memory cell or may be a nonvolatile memory cell. While it is described below that the memory device 100 is a vertical NAND flash device, it is to be understood that the technical idea of the disclosure is not limited thereto.

Each of the memory blocks BLK may be coupled to the row decoder (X-DEC) 120 through a plurality of row lines RL. The row lines RL may include at least one drain select line, a plurality of word lines and at least one source select line. The memory cell array 110 may be coupled to the page buffer circuit 130 through bit lines BL.

The row decoder (X-DEC) 120 may select any one from among the memory blocks BLK included in the memory cell array 110, in response to a row address X_A provided from the peripheral circuit (PERI circuit) 140. The row decoder (X-DEC) 120 may transfer an operating voltage X_V, provided from the peripheral circuit (PERI circuit) 140, to row lines RL coupled to a memory block BLK selected from among the memory blocks BLK included in the memory cell array 110.

The page buffer circuit 130 may include a plurality of page buffers PB, which are coupled to the bit lines BL, respectively. The page buffer circuit 130 may receive a page buffer control signal PB_C from the peripheral circuit (PERI circuit) 140, and may transmit and receive a data signal DATA to and from the peripheral circuit (PERI circuit) 140. The page buffer circuit 130 may control the bit lines BL, which are arranged in the memory cell array 110, in response to the page buffer control signal PB_C. For example, the page buffer circuit 130 may detect data, stored in a memory cell of the memory cell array 110, by sensing the signal of a bit line BL of the memory cell array 110 in response to the page buffer control signal PB_C, and may transmit the data signal DATA to the peripheral circuit (PERI circuit) 140 depending on the detected data. The page buffer circuit 130 may apply a signal to the bit line BL based on the data signal DATA, received from the peripheral circuit (PERI circuit) 140, in response to the page buffer control signal PB_C, and thereby, may write data to the memory cell of the memory cell array 110. The page buffer circuit 130 may write data to or read data from memory cells, which are coupled to an activated word line.

The peripheral circuit (PERI circuit) 140 may receive a command signal CMD, an address signal ADD and a control signal CTRL from outside the memory device 100, and may transmit and receive data DATA to and from a device outside the memory device 100, for example, a memory controller. The peripheral circuit (PERI circuit) 140 may output signals for writing data to the memory cell array 110 or reading data from the memory cell array 110, for example, the row address X_A, the page buffer control signal PB_C and so forth, based on the command signal CMD, the address signal ADD and the control signal CTRL. The peripheral circuit (PERI circuit) 140 may generate various voltages including the operating voltage X_V, which are required in the memory device 100.

Hereinbelow, in the accompanying drawings, two directions that are parallel to an active surface of a substrate and intersect with each other are defined as a first direction FD and a second direction SD, respectively, and a direction that vertically protrudes from the active surface of the substrate is defined as a vertical direction VD. For example, the first direction FD may correspond to the extending direction of word lines and/or the arrangement direction of bit lines, and the second direction SD may correspond to the extending direction of the bit lines and/or the arrangement direction of the word lines. The first direction FD and the second direction SD may substantially perpendicularly intersect with each other. The first direction FD correspond a row direction, and the second direction SD correspond a column direction. The vertical direction VD may perpendicularly intersect with the first direction FD and the second direction SD. In the drawings, a direction indicated by an arrow and a direction opposite thereto represent the same direction.

Figure 2:
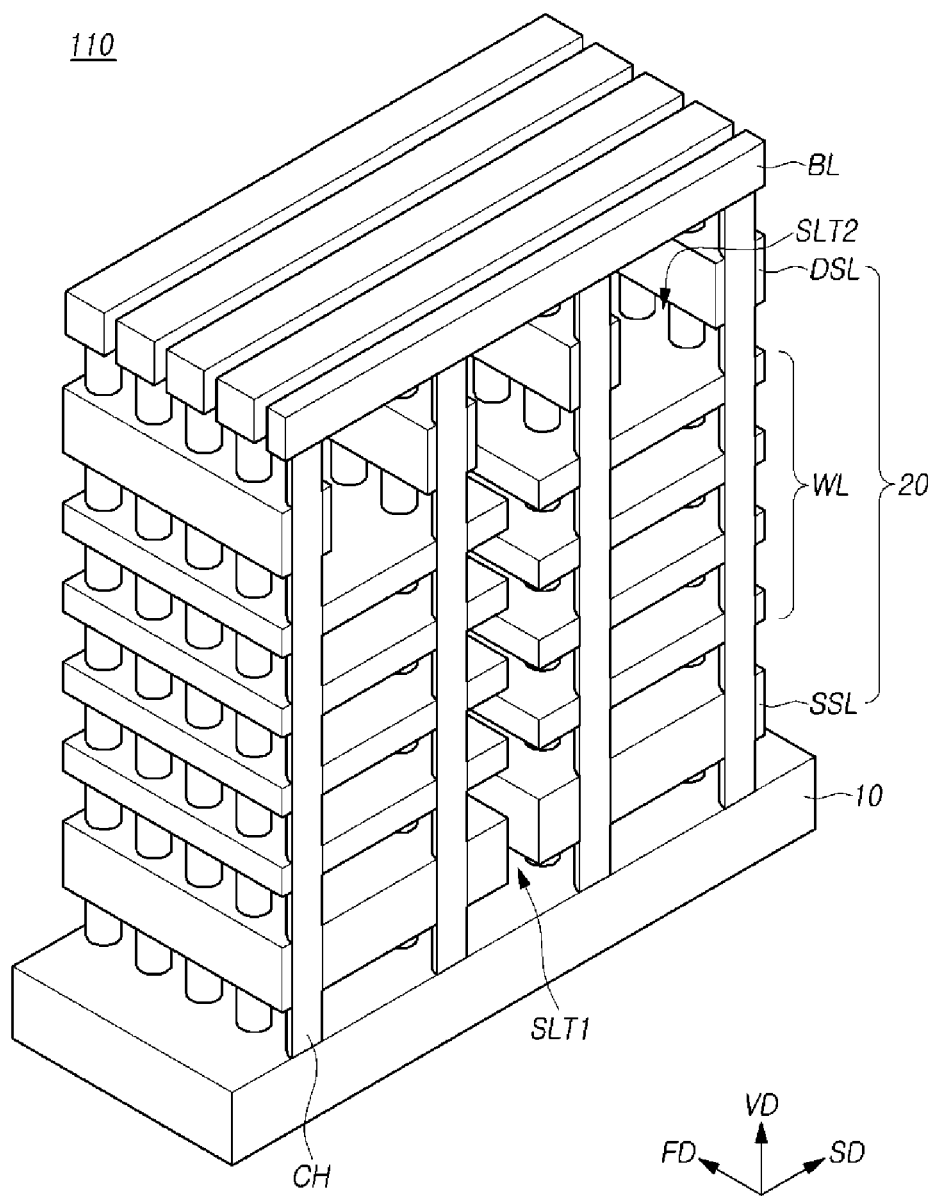
FIG. 2 is an exemplary perspective view illustrating a memory cell array of FIG. 1.

FIG. 2 is an exemplary perspective view illustrating a memory cell array of FIG. 1.

Referring to FIG. 2, a plurality of electrode layers 20 may be stacked on a substrate 10 in the vertical direction VD to be spaced apart from one another. Although not illustrated, a plurality of interlayer dielectric layers may be stacked alternately with the plurality of electrode layers 20 on the substrate 10.

The electrode layers 20 may include a conductive material. For example, the electrode layers 20 may include at least one selected from among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). Among the electrode layers 20, at least one electrode layer 20 from the lowermost electrode layer 20 may configure a source select line SSL. Among the electrode layers 20, at least one electrode layer 20 from the uppermost electrode layer 20 may configure a drain select line DSL. The electrode layers 20 between the source select line SSL and the drain select line DSL may configure word lines WL.

A plurality of vertical channels CH, which pass through the plurality of electrode layers 20 in the vertical direction VD, may be defined on the substrate 10. Each of the vertical channels CH may include a channel layer and a gate dielectric layer. The channel layer may include polysilicon or monocrystalline silicon, and may include, in some regions thereof, a p-type impurity such as boron (B). The channel layer may have the shape of a pillar that is completely filled up to its center, or a solid cylinder. In some embodiments, the channel layer may have the shape of a tube whose center region is open (not illustrated), and a buried dielectric layer may be formed in the open center region of the channel layer. The gate dielectric layer may have the shape of a straw or a cylindrical shell that surrounds the outer wall of the channel layer. Although not illustrated, the gate dielectric layer may include a tunnel dielectric layer, a charge storage layer and a blocking layer, which are sequentially stacked from the outer wall of the channel layer. The gate dielectric layer may have an ONO (oxide-nitride-oxide) stack structure in which an oxide layer, a nitride layer and an oxide layer are sequentially stacked.

A source select transistor may be formed in areas or regions where the source select line SSL surrounds the vertical channel CH, and a drain select transistor may be formed in areas or regions where the drain select line DSL surrounds the vertical channel CH. A memory cell may be formed in areas or regions where the word line WL surrounds the vertical channel CH.

First slits SLT1, which divide the source select line SSL, the drain select line DSL and the word lines WL, may be formed. A second slit SLT2, which divides the drain select line DSL, may be formed between adjacent first slits SLT1. Through placement of the first slits SLT1, the source select line SSL and the word lines WL may be divided into units of memory blocks. The drain select line DSL may be divided into units each smaller than a memory block, for example, units of sub-blocks, through arrangement of the first slits SLT1 and the second slit SLT2.

A plurality of bit lines BL may be defined over the drain select line DSL. The bit lines BL may extend in the second direction SD, and may be arranged in the first direction FD. The bit lines BL may be coupled to the plurality of vertical channels CH.

Figure 3:
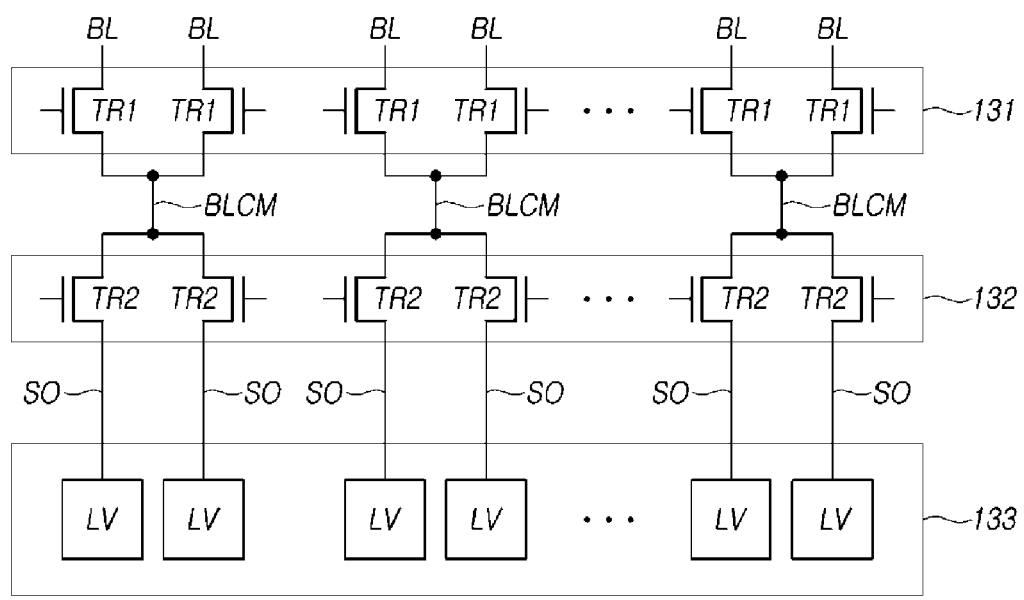
FIG. 3 is an exemplary circuit diagram illustrating a page buffer circuit of FIG. 1.

FIG. 3 is an exemplary circuit diagram illustrating a page buffer circuit of FIG. 1.

Referring to FIG. 3, a page buffer circuit 130 may include a bit line selection circuit 131, a page buffer high-voltage circuit 132, and a page buffer low-voltage circuit 133.

The bit line selection circuit 131 may include a plurality of select transistors TR1, which are coupled to a plurality of bit lines BL, respectively. Each of the select transistors TR1 may be coupled between a bit line BL and a bit line coupling node BLCM. A pair of select transistors TR1 may be coupled in common to each of the bit line coupling nodes BLCM.

Each of the select transistors TR1 may electrically couple the bit line BL and the bit line coupling node BLCM in response to a bit line select signal. Bit line select signals provided to the pair of select transistors TR1 that are coupled in common to one bit line coupling node BLCM may be activated at different times, or bit line select signals provided may only be activated one at time. For example, if a bit line select signal provided to one of the pair of select transistors TR1 coupled in common to one bit line coupling node BLCM is activated, then the bit line select signal provided to the other of the pair of select transistors TR1 may be deactivated.

The page buffer high-voltage circuit 132 may include a plurality of sensing transistors TR2, which correspond to the plurality of bit lines BL, respectively. Each of the sensing transistors TR2 may be coupled between a bit line coupling node BLCM and a sensing node SO. A pair of sensing transistors TR2 may be coupled in common to each of the bit line coupling nodes BLCM.

Each of the sensing transistors TR2 may electrically couple a bit line coupling node BLCM and a sensing node SO in response to a bit line sensing signal. Bit line sensing signals provided to the pair of sensing transistors TR2 that are coupled in common to one bit line coupling node BLCM may be activated at different times, or bit line sensing signals provided may only be activated one at time. For example, if the bit line sensing signal provided to one of the pair of sensing transistors TR2 coupled in common to one bit line coupling node BLCM is activated, then the bit line sensing signal provided to the other of the pair of sensing transistors TR2 may be deactivated.

The page buffer low-voltage circuit 133 may include a plurality of page buffer low-voltage units LV corresponding to the plurality of bit lines BL, respectively. The page buffer low-voltage units LV may be coupled to sensing nodes SO, respectively.

Each of the page buffer low-voltage units LV may include a latch. Each of the page buffer low-voltage units LV may apply a voltage to the sensing node SO based on data stored in the latch. The voltage applied to the sensing node SO may be transferred to a corresponding bit line BL through the page buffer high-voltage circuit 132 and the bit line selection circuit 131.

The latches of the page buffer low-voltage units LV may perform latching based on voltages of the sensing nodes SO. Latching may be performed based on voltages transferred from the bit lines BL to the sensing nodes SO through the bit line selection circuit 131 and the page buffer high-voltage circuit 132.

Figure 4:
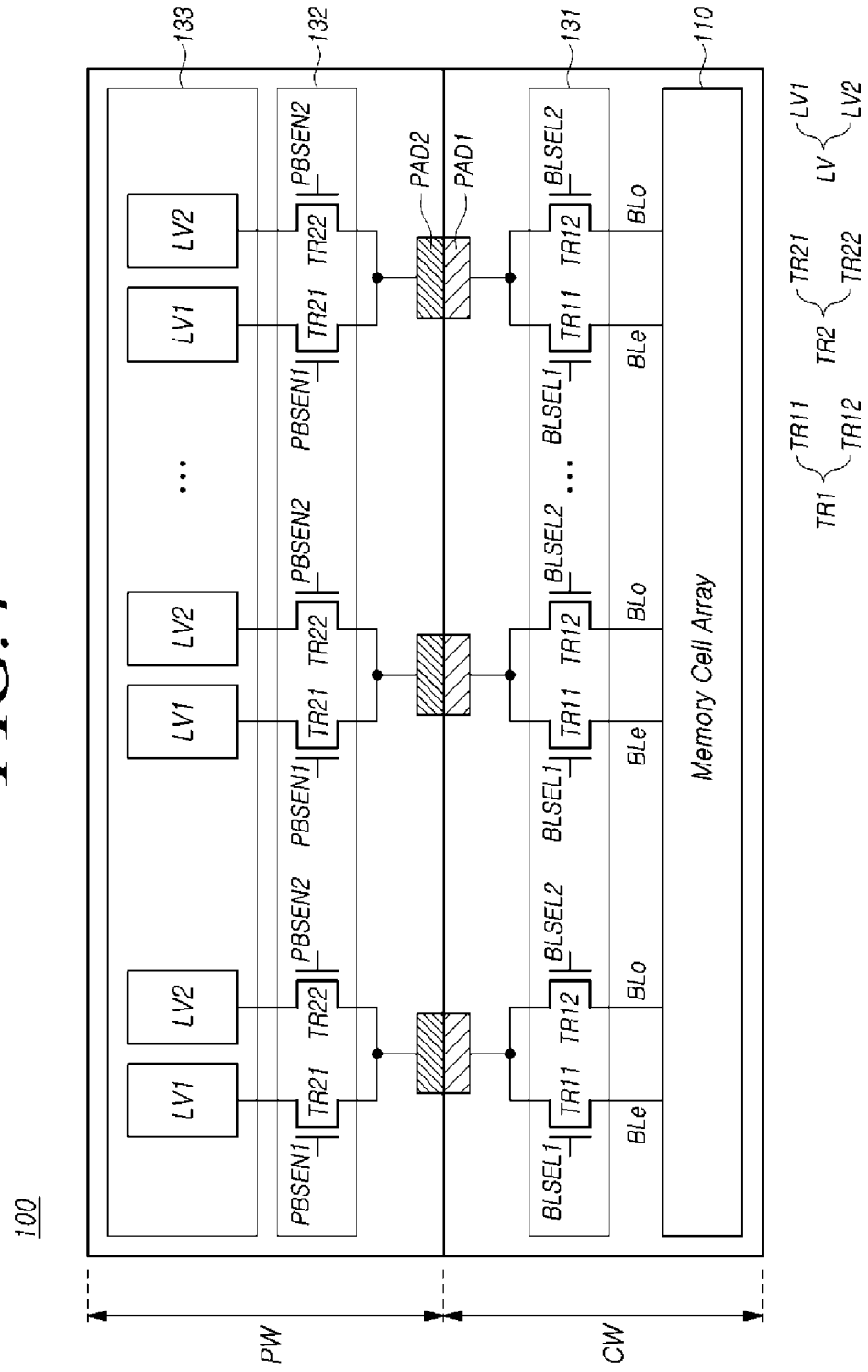
FIG. 4 is a cross-sectional view schematically illustrating a memory device in accordance with an embodiment of the disclosure.

FIG. 4 is a cross-sectional view schematically illustrating a memory device in accordance with an embodiment of the disclosure.

Referring to FIG. 4, a memory device 100 in accordance with an embodiment of the disclosure may include a cell wafer CW and a peripheral wafer PW that is bonded onto the cell wafer CW.

The cell wafer CW may include a memory cell array 110 and a bit line selection circuit 131. The cell wafer CW may include a plurality of first pads PAD1 on one surface thereof, which is bonded to the peripheral wafer PW, and the plurality of first pads PAD1 of the cell wafer CW may be coupled to the bit line selection circuit 131.

Select transistors TR1 of the bit line selection circuit 131 may be divided into first select transistors TR11, which are coupled to even bit lines BLe, and second select transistors TR12 which are coupled to odd bit lines BLo.

Each of the plurality of first pads PAD1 may be coupled in common to one of the first select transistors TR11 and one of the second select transistors TR12. In this case, the number of the first pads PAD1 may be half of the number of bit lines BL.

The first select transistors TR11 may electrically couple the even bit lines BLe and the first pads PAD1 in response to a first bit line select signal BLSEL1. The second select transistors TR12 may electrically couple the odd bit lines BLo and the first pads PAD1 in response to a second bit line select signal BLSEL2.

The first bit line select signal BLSEL1 and the second bit line select signal BLSEL2 may be activated at different times, or bit line select signals provided may only be activated one at time. When the first bit line select signal BLSEL1 is activated and the second bit line select signal BLSEL2 is deactivated or not activated, the first select transistors TR11 may electrically couple the even bit lines BLe and the first pads PAD1, and the second select transistors TR12 may electrically decouple or not couple the odd bit lines BLo and the first pads PAD1.

Conversely, when the second bit line select signal BLSEL2 is activated and the first bit line select signal BLSEL1 is deactivated or not activated, the second select transistors TR12 may electrically couple the odd bit lines BLo and the first pads PAD1, and the first select transistors TR11 may electrically decouple or not couple the even bit lines BLe and the first pads PAD1.

The peripheral wafer PW may include a page buffer high-voltage circuit 132 and a page buffer low-voltage circuit 133. Although not illustrated, the peripheral wafer PW may further include a row decoder (120 of FIG. 1) and a peripheral circuit (140 of FIG. 1).

Page buffer low-voltage units LV of the page buffer low-voltage circuit 133 may be divided into a plurality of first page buffer low-voltage units LV1 corresponding to the even bit lines BLe and a plurality of second page buffer low-voltage units LV2 corresponding to the odd bit lines BLo. The peripheral wafer PW may include a plurality of second pads PAD2 on one surface thereof, which is bonded to the cell wafer CW, and the plurality of second pads PAD2 may be coupled to the plurality of first pads PAD1, respectively. The number of the second pads PAD2 may be the same as the number of the first pads PAD1, and may be half of the number of the bit lines BL.

Sensing transistors TR2 of the page buffer high-voltage circuit 132 may be divided into first sensing transistors TR21 corresponding to the even bit lines BLe and second sensing transistors TR22 corresponding to the odd bit lines BLo.

Each of the plurality of second pads PAD2 may be coupled in common to one of the first sensing transistors TR21 and one of the second sensing transistors TR22. The first sensing transistors TR21 may be coupled between the first page buffer low-voltage units LV1 and the second pads PAD2, and may electrically couple the first page buffer low-voltage units LV1 and the second pads PAD2 in response to a first bit line sensing signal PBSEN1. The second sensing transistors TR22 may be coupled between the second page buffer low-voltage units LV2 and the second pads PAD2, and may electrically couple the second page buffer low-voltage units LV2 and the second pads PAD2 in response to a second bit line sensing signal PBSEN2.

The first bit line sensing signal PBSEN1 and the second bit line sensing signal PBSEN2 may be activated at different times, or the bit line sensing signals provided may only be activated one at time. When the first bit line sensing signal PBSEN1 is activated and the second bit line sensing signal PBSEN2 is deactivated or not activated, the first sensing transistors TR21 may electrically couple the first page buffer low-voltage units LV1 and the second pads PAD2, and the second sensing transistors TR22 may electrically decouple or not couple the second page buffer low-voltage units LV2 and the second pads PAD2.

Conversely, when the second bit line sensing signal PBSEN2 is activated and the first bit line sensing signal PBSEN1 is deactivated or not activated, the second sensing transistors TR22 may electrically couple the second page buffer low-voltage units LV2 and the second pads PAD2, and the first sensing transistors TR21 may electrically decouple or not couple the first page buffer low-voltage units LV1 and the second pads PAD2.

Figure 5:
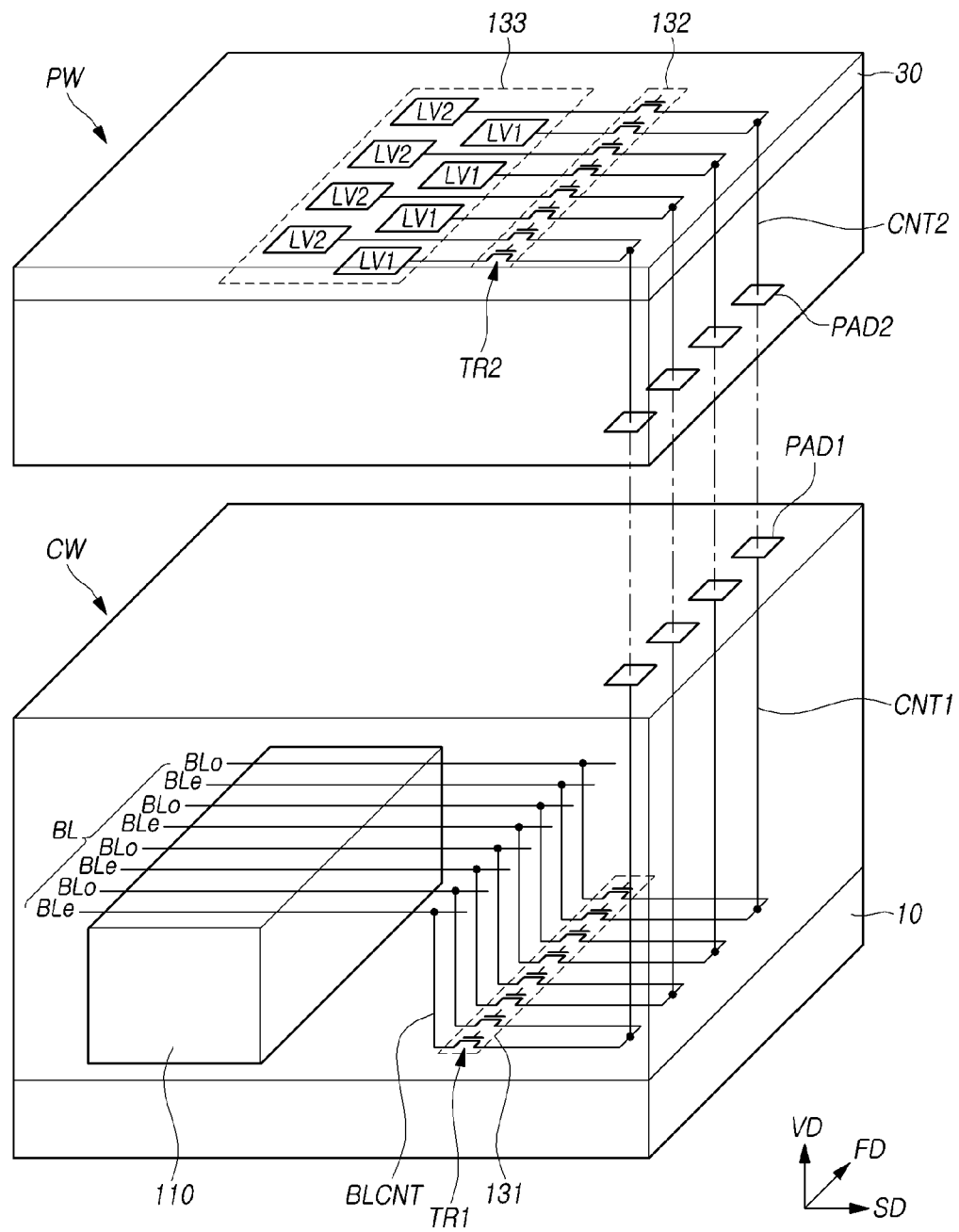
FIG. 5 is a view illustrating a schematic layout of a memory device in accordance with an embodiment of the disclosure.

FIG. 5 is a view illustrating a schematic layout of a memory device in accordance with an embodiment of the disclosure.

Referring to FIG. 5, a cell wafer CW may include a substrate 10. The substrate 10 may have an active surface and a back surface. In FIG. 5, the substrate 10 is disposed such that the active surface faces up. A memory cell array 110 and a bit line selection circuit 131 may be disposed on the active surface of the substrate 10.

A plurality of bit lines BL may be disposed over the memory cell array 110 and the bit line selection circuit 131. The bit lines BL may be coupled to the memory cell array 110 and the bit line selection circuit 131. Each of the bit lines BL may be coupled to a corresponding select transistor TR1 through a bit line contact BLCNT.

First pads PAD1 may be disposed on one surface of the cell wafer CW, which is bonded to a peripheral wafer PW. For example, the first pads PAD1 may be disposed in the first direction FD at an edge of the one surface of the cell wafer CW. Each of the first pads PAD1 may be coupled to a corresponding pair of select transistors TR1 through a first contact CNT1, and may be coupled to a corresponding even bit line BLe and a corresponding odd bit line BLo through the corresponding pair of select transistors TR1. The even bit line BLe and the odd bit line BLo sharing a first pad PAD1 may be disposed adjacent to each other.

The peripheral wafer PW may include a substrate 30. The substrate 30 may have an active surface and a back surface that faces away from the active surface. In FIG. 5, the substrate 30 is disposed such that the active surface faces down. A page buffer high-voltage circuit 132 and a page buffer low-voltage circuit 133 may be disposed on the active surface of the substrate 30.

Second pads PAD2 may be disposed on one surface of the peripheral wafer PW, which is bonded to the cell wafer CW. For example, the second pads PAD2 may be disposed in the first direction FD at an edge of the one surface of the peripheral wafer PW.

Each of the second pads PAD2 may be coupled to a corresponding pair of sensing transistors TR2 through a second contact CNT2, and may be coupled to a corresponding first page buffer low-voltage unit LV1 and a corresponding second page buffer low-voltage unit LV2 through the corresponding pair of sensing transistors TR2. One first page buffer low-voltage unit LV1 and one second page buffer low-voltage unit LV2 may share one second pad PAD2.

In order to facilitate understanding, FIG. 5 and FIGS. 6, 8 and 9 to be described later illustrate that the cell wafer CW and the peripheral wafer PW are separated from each other, but it should be understood that the top surface of the cell wafer CW and the bottom surface of the peripheral wafer PW are in contact with each other.

Figure 6:
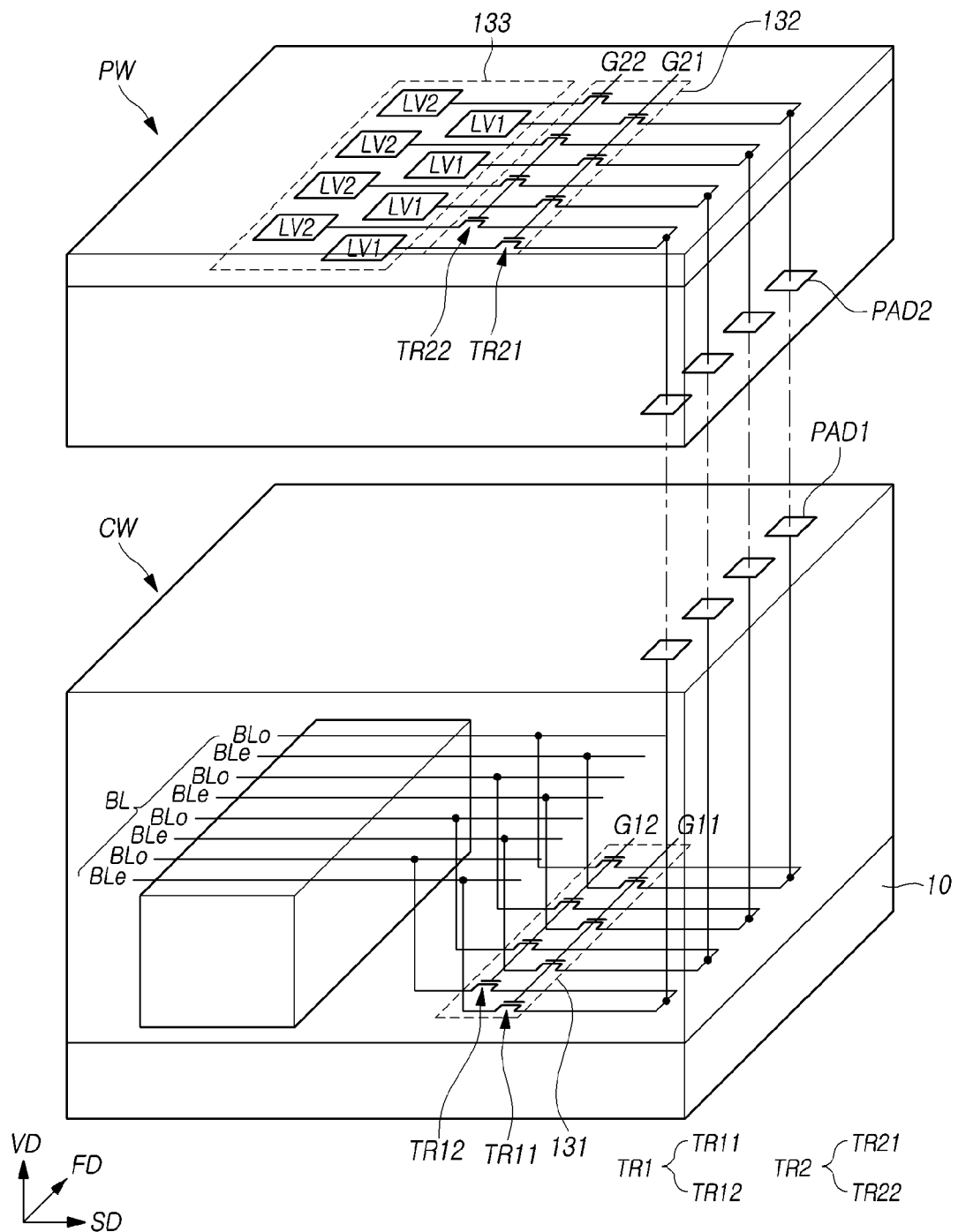
FIG. 6 is a view illustrating a layout of select transistors and sensing transistors of FIG. 5 in accordance with another embodiment of the disclosure.

FIG. 6 is a view illustrating a layout of select transistors and sensing transistors in accordance with another embodiment of the disclosure. Other elements described below are substantially the same as the identical elements described above with reference to FIG. 5.

Referring to FIG. 6, select transistors TR1 included in a bit line selection circuit 131 may be divided into first select transistors TR11 that are coupled to even bit lines BLe and second select transistors TR12 that are coupled to odd bit lines BLo. The first select transistors TR11 and the second select transistors TR12 may be disposed in different rows. The first select transistors TR11, which are coupled to the even bit lines BLe, may be disposed in a first row, and the second select transistors TR12, which are coupled to the odd bit lines BLo, may be disposed in a second row.

The first select transistors TR11 may share one gate line G11, which extends in the row direction, that is, the first direction FD, and the second select transistors TR12 may share one gate line G12, which extends in the first direction FD. The gate line G11 and the gate line G12 may be disposed parallel to each other. The first select transistors TR11 may be collectively turned on or off in response to a signal applied to the gate line G11. The second select transistors TR12 may be collectively turned on or off in response to a signal applied to the gate line G12.

Sensing transistors TR2 included in the page buffer high-voltage circuit 132 may be divided into first sensing transistors TR21 corresponding to even bit lines BLe and second sensing transistors TR22 corresponding to odd bit lines BLo, and the first sensing transistors TR21 and the second sensing transistors TR22 may be disposed in different rows. For example, the first sensing transistors TR21, which are coupled to first page buffer low-voltage units LV1, may be disposed in a first row, and the second sensing transistors TR22, which are coupled to second page buffer low-voltage units LV2, may be disposed in a second row.

The first sensing transistors TR21 may share one gate line G21, which extends in the first direction FD (row direction). The second sensing transistors TR22 may share one gate line G22, which extends in the first direction FD. The gate line G21 and the gate line G22 may be disposed parallel to each other. The first sensing transistors TR21 may be collectively turned on or off in response to a signal applied to the gate line G21, and the second sensing transistors TR22 may be collectively turned on or off in response to a signal applied to the gate line G22.

Figure 7A:
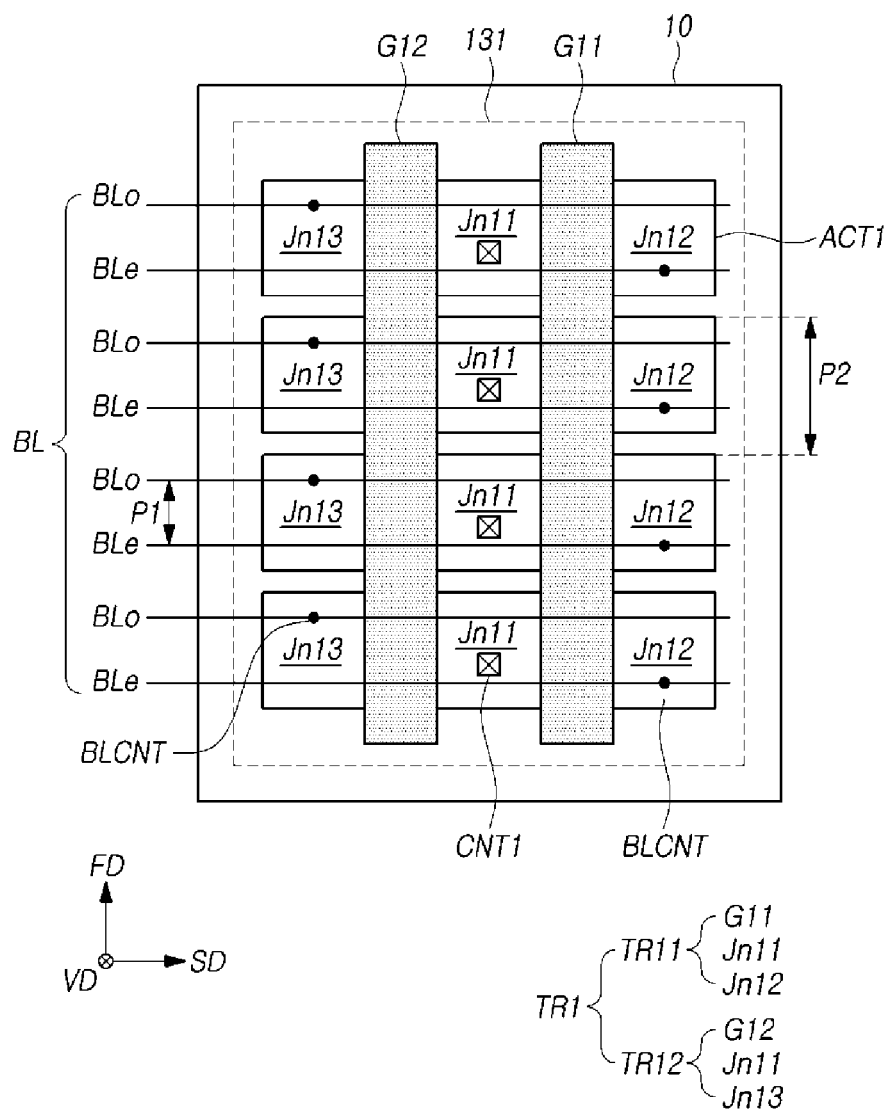
FIG. 7A is a top view illustrating a layout of select transistors, bit line contacts and first contacts of FIG. 6.

FIG. 7A is a top view illustrating a layout of select transistors, bit line contacts and first contacts of FIG. 6.

Referring to FIG. 7A, a plurality of active regions ACT1 may be arranged in the first direction FD on the substrate 10. The gate lines G11 and G12 may extend in the first direction FD and traverse the active regions ACT1, and may be disposed parallel to each other. An impurity is implanted into the active regions ACT1 on both sides of the gate lines G11 and G12 to form junction regions Jn11 to Jn13.

The gate line G11 and the junction regions Jn11 and Jn12 on both sides of the gate line G11 may configure first select transistors TR11. The gate line G12 and the junction regions Jn11 and Jn13 on both sides of the gate line G12 may configure second select transistors TR12. A first select transistor TR11 and a second select transistor TR12 that are disposed in one active region ACT1 may share one junction region Jn11. The junction region Jn11 may be coupled to a first pad PAD1 (see FIG. 5) through a first contact CNT1.

In correspondence to the plurality of active regions ACT1, which are arranged in the first direction FD, the plurality of first select transistors TR11 may be arranged in the first direction FD along the gate line G11. Similarly, the plurality of second select transistors TR12 may be arranged in the first direction FD along the gate line G12.

The bit lines BL may be disposed over the first and second select transistors TR11 and TR12. The bit lines BL may extend in the second direction SD, and may be arranged in the first direction FD. Each of the junction regions Jn12 of the first select transistors TR11 and the junction regions Jn13 of the second select transistors TR12 may be coupled to a corresponding bit line BL through a bit line contact BLCNT.

As illustrated in FIG. 7A, the select transistors TR1 are divided into the first select transistors TR11 that are coupled to the even bit lines BLe and the second select transistors TR12 that are coupled to the odd bit lines BLo, and the first select transistors TR11 and the second select transistors TR12 are disposed in different rows. As a result, the junction regions Jn12 of the first select transistors TR11 and the junction regions Jn13 of the second select transistors TR12 will be disposed in different rows. Due to this fact, the bit line contacts BLCNT, which are coupled to the junction regions Jn12 of the first select transistors TR11 and to the junction regions Jn13 of the second select transistors TR12, may be disposed in a zigzag style. Such a disposition in a zigzag style means that the bit line contacts BLCNT are disposed not to be adjacent to each other in the first direction FD, being the row direction, or that along the first direction FD, the bit line contacts BLCNT are offset from each other in the first direction FD and in the second direction SD.

As the degree of integration of a memory device increases, the interval or pitch between the bit lines BL is narrowing. For example, if two bit line contacts are adjacent to each other in the same row, then there is high possibility of the occurrence of a failure in which the two bit line contacts are shorted to each other. According to embodiments disclosed herein, the bit line contacts BLCNT are disposed not to be adjacent to each other in the row direction, so it is possible to suppress the occurrence of a failure in which the bit line contacts BLCNT are shorted to each other.

The pitch of the bit lines BL in the first direction FD may have a first size P1. The pitch of the select transistors TR1 in the first direction FD may have a second size P2 that is larger than the first size P1.

In comparison, if all select transistors are disposed in one row in the first direction FD as a direction in which bit lines are arranged, then it is necessary to configure the select transistors to have a size corresponding to the pitch of the bit lines. In this case, if the pitch of the bit lines decreases due to an increase in the degree of integration, the size of the select transistors becomes very small, so that the margin of a select transistor manufacturing process becomes tight, and there is high probability that a failure occurs during the manufacturing process.

According to the embodiments herein, select transistors TR1 are divided into the first select transistors TR11 and the second select transistors TR12, and the first select transistors TR11 and the second select transistors TR12 are disposed in different rows, so it is possible to increase the size of the select transistors TR1 as compared to the case where all the select transistors TR1 are disposed in one row. Therefore, the margin of a process for manufacturing the select transistor TR1 may be increased, thereby contributing to suppressing the occurrence of a failure during the process for manufacturing the select transistor TR1.

Although FIG. 7A illustrates a case in which all the first select transistors TR11 are disposed in the same row and all the second select transistors TR12 are disposed in the same row, the disclosure is not limited thereto. The first select transistors TR11 may be divisionally disposed in two or more rows, and the second select transistors TR12 may be divisionally disposed in two or more rows.

Figure 7B:
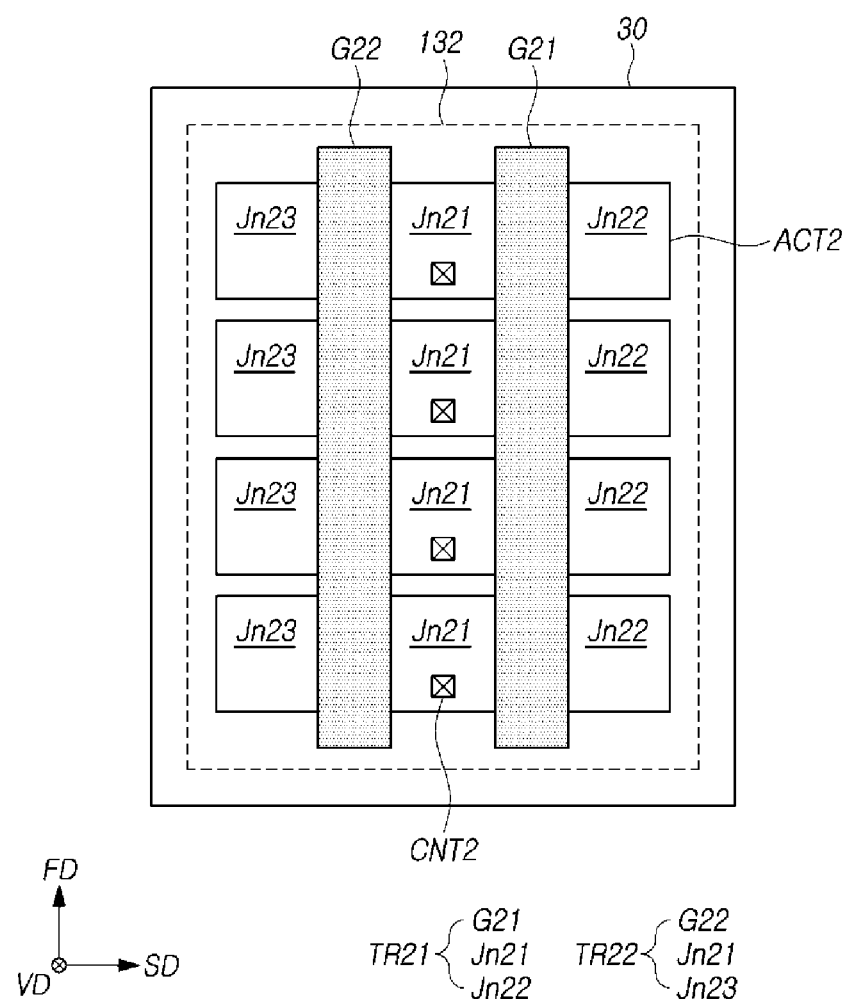
FIG. 7B is a top view illustrating a layout of sensing transistors and second contacts of FIG. 6.

FIG. 7B is a top view illustrating a layout of sensing transistors and second contacts of FIG. 6.

Referring to FIG. 7B, a plurality of active regions ACT2 may be arranged in the first direction FD on a substrate 30. Gate lines G21 and G22 may traverse the active regions ACT2 in the first direction FD, and may be disposed parallel to each other. As an impurity is implanted into the active regions ACT2 on both sides of the gate lines G21 and G22, junction regions Jn21 to Jn23 may be formed.

The gate line G21 and the junction regions Jn21 and Jn22 on both sides of the gate line G21 may configure a first sensing transistor TR21. The gate line G22 and the junction regions Jn21 and Jn23 on both sides of the gate line G22 may configure a second sensing transistor TR22. The first sensing transistor TR21 and the second sensing transistor TR22 that are disposed in one active region ACT2 may share one junction region Jn21. The junction region Jn21 may be coupled to the second pad PAD2 (see FIG. 5) through a second contact CNT2.

In correspondence to the plurality of active regions ACT2, which are arranged in the first direction FD, the plurality of first sensing transistors TR21 may be arranged in the first direction FD along the gate line G21. Similarly, the plurality of second sensing transistors TR22 may be arranged in the first direction FD along the gate line G22.

In FIG. 7B, the sensing transistors TR2 are divided into the first sensing transistors TR21 and the second sensing transistors TR22, and the first sensing transistors TR21 and the second sensing transistors TR22 are disposed in different rows (see FIG. 6). Consequently, it is possible to increase the size of the sensing transistors TR2 as compared to the case where all the sensing transistors TR2 are disposed in one row. Therefore, the margin of a process for manufacturing the sensing transistor TR2 may be increased, thereby contributing to suppressing the occurrence of a failure during the process for manufacturing the sensing transistor TR2.

Although the present embodiment illustrates a case where all the first sensing transistors TR21 are disposed in the same row and all the second sensing transistors TR22 are disposed in the same row, the disclosure is not limited thereto. The first sensing transistors TR21 may be divisionally disposed in two or more rows, and the second sensing transistors TR22 may be divisionally disposed in two or more rows.

Figure 8:
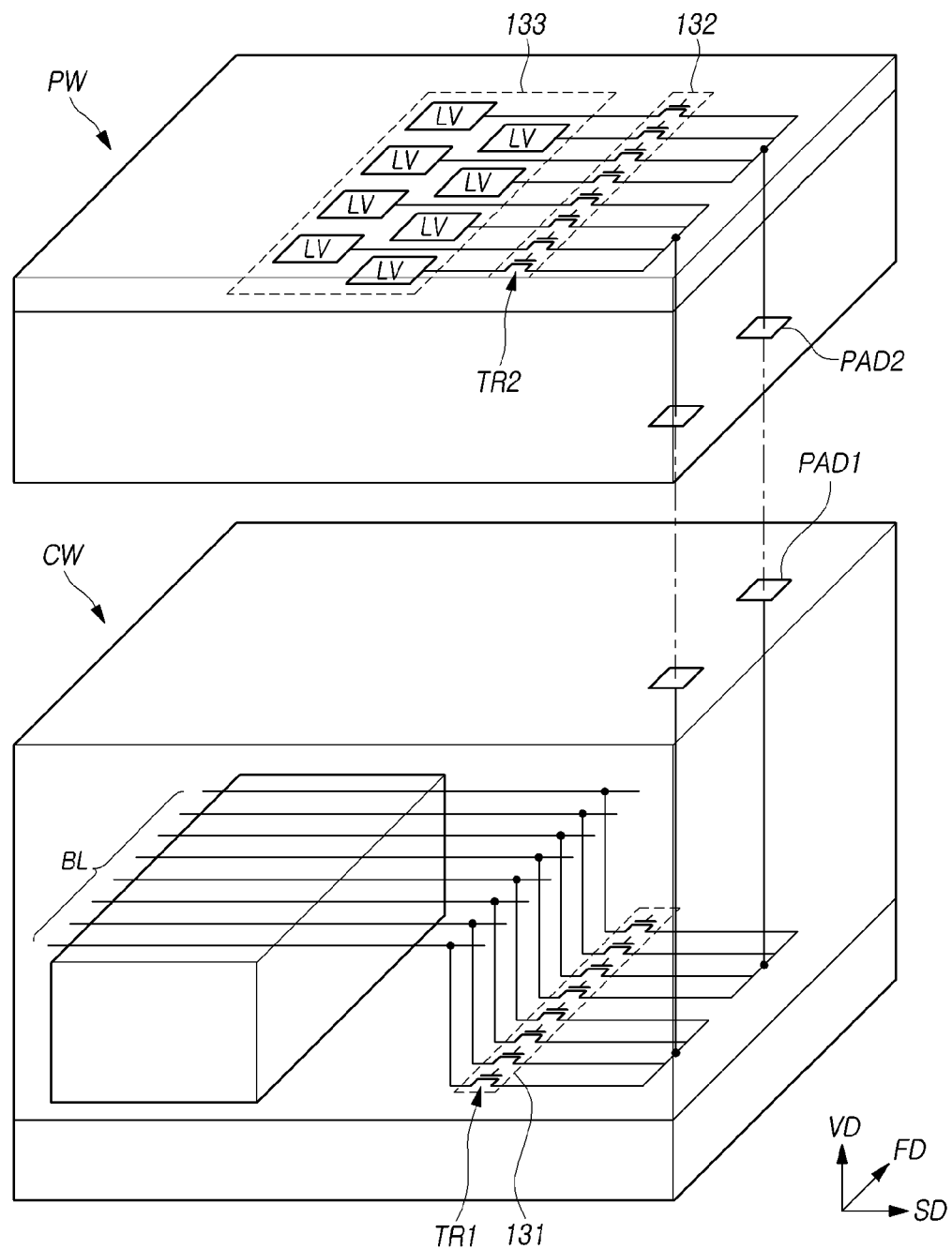
FIG. 8 is a view illustrating a memory device in accordance with a further embodiment of the disclosure.

FIG. 8 is a view illustrating a memory device in accordance with a further embodiment of the disclosure.

Referring to FIG. 8, each of a plurality of first pads PAD1 may be coupled in common to four bit lines BL through a bit line selection circuit 131. In this case, it may be defined that four bit lines BL share one first pad PAD1, and the number of the first pads PAD1 may be ¼ of the number of bit lines BL.

Select transistors TR1 of the bit line selection circuit 131 may be grouped into a plurality of bit line selection groups. Select transistors TR1 included in a single bit line selection group may be collectively turned on or off in response to one bit line select signal. When the select transistors TR1 included in a single bit line selection group are simultaneously turned on, the turned-on select transistors TR1 may transfer, in parallel, data of corresponding bit lines BL to a page buffer low-voltage circuit 133 through a page buffer high-voltage circuit 132.

Select transistors TR1 that share one first pad PAD1 may be included in different bit line selection groups. Bit line select signals provided to the select transistors TR1 that share one first pad PAD1 may be activated at different times, or only one bit line select signal at a time is activated. When any one of the bit line select signals provided to the select transistors TR1 that share one first pad PAD1 is activated, the others may be deactivated.

Each of a plurality of second pads PAD2 may be coupled in common to four bit lines BL through the first pad PAD1 and the bit line selection circuit 131. In this case, it may be defined that four bit lines BL share one second pad PAD2, and the number of the second pads PAD2 may be ¼ of the number of the bit lines BL.

Sensing transistors TR2 of the page buffer high-voltage circuit 132 may be grouped into a plurality of bit line sensing groups. Sensing transistors TR2 included in a single bit line sensing group may be collectively turned on or off in response to one bit line sensing signal. When the sensing transistors TR2 included in a single bit line sensing group are simultaneously turned on, the turned-on sensing transistors TR2 may transfer, in parallel, data, provided from corresponding bit lines BL through the bit line selection circuit 131, to the page buffer low-voltage circuit 133.

Sensing transistors TR2 that share one second pad PAD2 may be included in different bit line sensing groups. Bit line sensing signals provided to the sensing transistors TR2 that share one second pad PAD2 may be activated at different times, or only one bit line select signal at a time is activated. When any one of the bit line sensing signals provided to the sensing transistors TR2 that share one second pad PAD2 is activated, all the others may be deactivated.

Figure 9:
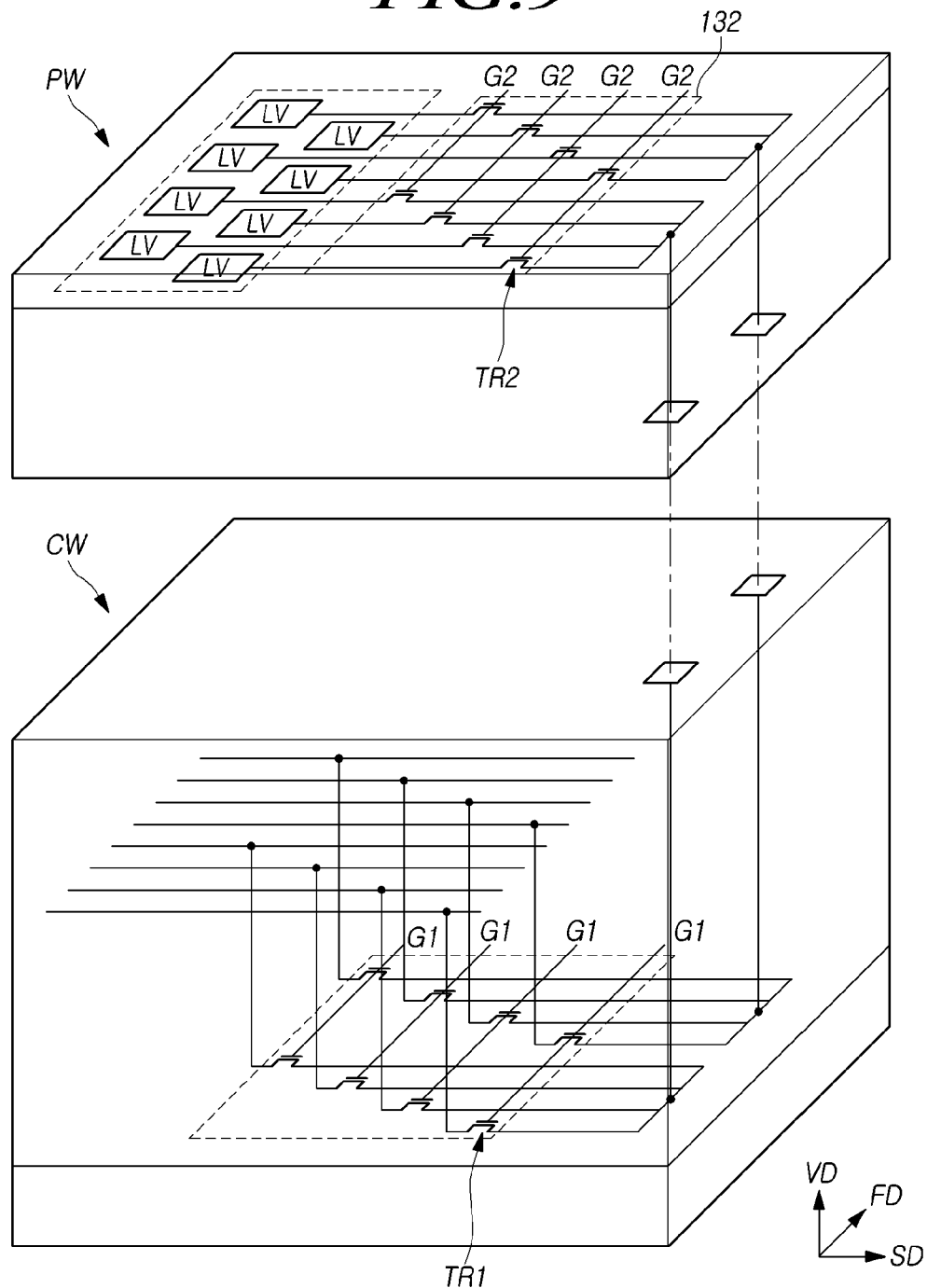
FIG. 9 is a view illustrating a memory device in accordance with yet another embodiment of the disclosure.

FIG. 9 is a view illustrating a memory device in accordance with yet another embodiment of the disclosure.

Referring to FIG. 9, select transistors TR1 of a bit line selection circuit 131 may be grouped into a plurality of bit line selection groups, and the plurality of bit line selection groups may be disposed in different rows, respectively. For example, the select transistors TR1 may be grouped into four bit line selection groups, and may be divisionally disposed in four rows.

Select transistors TR1 that are included in a single bit line selection group may share one gate line G1, which extends in the row direction, that is, the first direction FD.

Sensing transistors TR2 of a page buffer high-voltage circuit 132 may be grouped into a plurality of bit line sensing groups, and the plurality of bit line sensing groups may be disposed in different rows, respectively. For example, the sensing transistors TR2 may be grouped into four bit line sensing groups, and may be divisionally disposed in four rows.

Sensing transistors TR2 that are included in a single bit line sensing group may share one gate line G2, which extends in the row direction, that is, the first direction FD.

As a memory device trends toward high capacity, the number of bit lines included in the memory device is increasing. According to the embodiments disclosed herein, because a plurality of bit lines share one pad, the number of pads may be reduced by half as compared to a structure in which bit lines individually use pads. Accordingly, it is possible to increase the size of the pad, and a pad alignment margin may be increased when a cell wafer and a peripheral wafer are bonded to each other, thereby contributing to suppressing the occurrence of a pad coupling failure.

With the introduction of a three-dimensional structure, a layout area occupied by a memory cell array is decreasing. On the other hand, in order to improve performance, the structure of a logic circuit that controls the memory cell array is complicated, and an occupation area thereof is increasing. Due to this fact, a layout area required for disposing the logic circuit becomes larger than a layout area required for disposing the memory cell array. According to the embodiments of the disclosure, by disposing a bit line selection circuit of the logic circuit in the cell wafer, it is possible to increase the layout utilization efficiencies of the cell wafer and the peripheral wafer, thereby contributing to reducing the size of the memory device.

Figure 10:
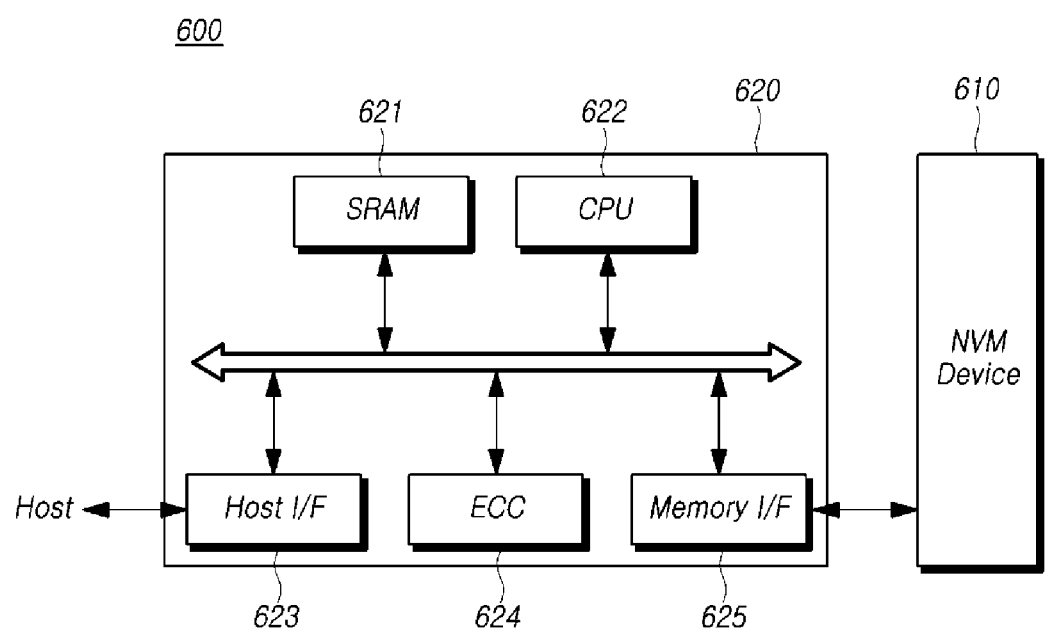
FIG. 10 is a block diagram schematically illustrating a memory system including a memory device in accordance with an embodiment of the disclosure.

FIG. 10 is a block diagram schematically illustrating a memory system including a memory device in accordance with an embodiment of the disclosure.

Referring to FIG. 10, a memory system 600 in accordance with an embodiment may include a nonvolatile memory device (NVM Device) 610 and a memory controller 620.

The nonvolatile memory device (NVM Device) 610 may be constituted by a memory device described above and may operate in the manner described above. The memory controller 620 may be configured to control the nonvolatile memory device (NVM Device) 610. By the combination of the nonvolatile memory device (NVM Device) 610 and the memory controller 620, a memory card or a solid state disk (SSD) may be provided. An SRAM 621 is used as a working memory of a processing unit (CPU) 622. A host interface (Host I/F) 623 includes a data exchange protocol of a host, which is coupled with the memory system 600.

An error correction code block (ECC) 624 detects and corrects an error included in data read from the nonvolatile memory device (NVM Device) 610.

A memory interface (Memory I/F) 625 interfaces with the nonvolatile memory device (NVM Device) 610 of the present embodiment. The processing unit (CPU) 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device (NVM Device) 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

Figure 11:
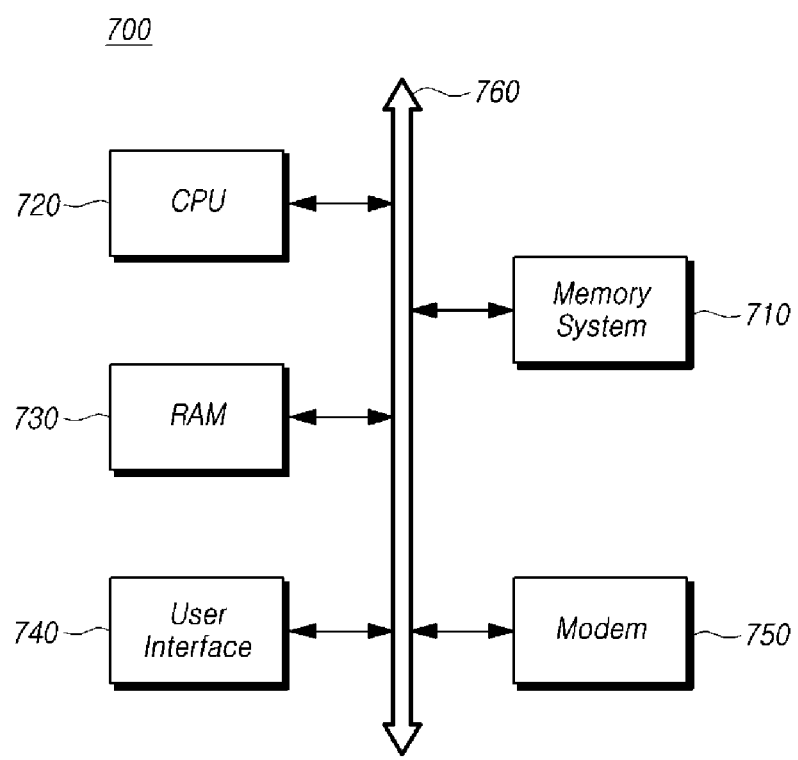
FIG. 11 is a block diagram schematically illustrating a computing system including a memory device in accordance with an embodiment of the disclosure.

FIG. 11 is a block diagram schematically illustrating a computing system including a memory device in accordance with an embodiment of the disclosure.

Referring to FIG. 11, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A memory device comprising:
a cell wafer having a first pad on one surface thereof; and
a peripheral wafer bonded to the one surface of the cell wafer, and having a second pad coupled to the first pad,
wherein the second pad is directly on the first pad,
wherein the cell wafer comprises:
a memory cell array including a drain select transistor;
a first bit line and a second bit line coupled to the memory cell array; and
a bit line selection circuit including a first select transistor coupled between the first bit line and the first pad, and configured to electrically couple the first bit line and the first pad in response to a first bit line select signal and a second select transistor coupled between the second bit line and the first pad, and configured to electrically couple the second bit line and the first pad in response to a second bit line select signal, wherein both the first select transistor and the second select transistor are connected to the second pad through the first pad, and
wherein the peripheral wafer comprises:
a page buffer low-voltage circuit including a first page buffer low-voltage unit corresponding to the first bit line and a second page buffer low-voltage unit corresponding to the second bit line; and a page buffer high-voltage circuit configured to couple one of the first page buffer low-voltage unit and the second page buffer low-voltage unit to the second pad.

2. The memory device according to claim 1,
wherein a number of first pads is half of a number of first and second bit lines,
wherein a number of second pads is half of the number of first and second bit lines, and
wherein the first bit line select signal and the second bit line select signal are activated at different times.

3. The memory device according to claim 1,
wherein the first select transistor and the second select transistor share a first junction region, and
wherein the first pad is coupled to the first junction region through a contact.

4. The memory device according to claim 1,
wherein a number of first pads is half of a number of first and second bit lines,
wherein a number of second pads is half of the number of first and second bit lines,
wherein the page buffer high-voltage circuit comprises:
a first sensing transistor coupled between the second pad and the first page buffer low-voltage unit, and configured to electrically couple the second pad and the first page buffer low-voltage unit in response to a first bit line sensing signal; and
a second sensing transistor coupled between the second pad and the second page buffer low-voltage unit, and configured to electrically couple the second pad and the second page buffer low-voltage unit in response to a second bit line sensing signal,
wherein the first bit line sensing signal and the second bit line sensing signal are activated at different times, and
wherein both the first sensing transistor and the second sensing transistor are connected to the first pad through the second pad.

5. The memory device according to claim 4,
wherein the first sensing transistor and the second sensing transistor share a second junction region, and
wherein the second pad is coupled to the second junction region through a contact.

6. The memory device according to claim 1, wherein the memory cell array comprises:
a plurality of electrode layers and a plurality of interlayer dielectric layers alternately stacked on a substrate; and
a plurality of vertical channels that pass through the plurality of electrode layers and the plurality of interlayer dielectric layers and that are coupled to the first bit line and the second bit line.

7. A memory device comprising:
a cell wafer having a plurality of first pads on one surface thereof; and
a peripheral wafer bonded to the one surface of the cell wafer, and having a plurality of second pads that are coupled to the plurality of first pads,
wherein each of the plurality of second pads is directly on a corresponding one of the plurality of first pads,
wherein the cell wafer comprises:
a memory cell array including a drain select transistor;
a plurality of bit lines, coupled to the memory cell array, that includes a plurality of first bit lines and a plurality of second bit lines; and
a bit line selection circuit comprising a plurality of select transistors,
wherein the plurality of select transistors comprises:
a plurality of first select transistors coupled between the plurality of first bit lines and the plurality of first pads, and configured to electrically couple the plurality of first bit lines and the plurality of first pads in response to a first bit line select signal; and
a plurality of second select transistors coupled between the plurality of second bit lines and the plurality of first pads, and configured to electrically couple the plurality of second bit lines and the plurality of first pads in response to a second bit line select signal,
wherein the plurality of first select transistors and the plurality of second select transistors are connected to the plurality of second pads through the plurality of first pads, and
wherein the peripheral wafer comprises:
a page buffer low-voltage circuit including a plurality of first page buffer low-voltage units corresponding to the plurality of first bit lines and a plurality of second page buffer low-voltage units corresponding to the plurality of second bit lines; and
a page buffer high-voltage circuit configured to couple the plurality of first page buffer low-voltage units or the plurality of second page buffer low-voltage units to the plurality of second pads.

8. The memory device according to claim 7, wherein the plurality of first bit lines and the plurality of second bit lines are alternately disposed with each other.

9. The memory device according to claim 7,
wherein a number of first pads in the plurality of first pads is half of a number of bit lines in the plurality of bit lines,
wherein a number of second pads in the plurality of second pads is half of the number of bit lines in the plurality of bit lines,
wherein the first bit line select signal and the second bit line select signal are activated at different times.

10. The memory device according to claim 9,
wherein a first select transistor and a second select transistor are coupled in common to each of the plurality of first pads and share a junction region, and
wherein each of the plurality of first pads is coupled to the junction region through a contact.

11. The memory device according to claim 9, wherein the plurality of first select transistors and the plurality of second select transistors are disposed in different rows.

12. The memory device according to claim 11, wherein a pitch of the plurality of first select transistors in a row direction is larger than a pitch of the bit lines in the row direction.

13. The memory device according to claim 11,
wherein each of the plurality of select transistors is coupled to a corresponding bit line through a bit line contact, and
wherein bit line contacts are offset from each other in the row direction and in a column direction.

14. The memory device according to claim 7,
wherein a number of first pads in the plurality of first pads is half of a number of bit lines in the plurality of bit lines,
wherein a number of second pads in the plurality of second pads is half of the number of bit lines in the plurality of bit lines,
wherein the page buffer high-voltage circuit comprises a plurality of sensing transistors,
wherein the plurality of sensing transistors comprises:
a plurality of first sensing transistors coupled between the plurality of first page buffer low-voltage units and the plurality of second pads, and configured to electrically couple the plurality of first page buffer low-voltage units and the plurality of second pads in response to a first bit line sensing signal; and a plurality of second sensing transistors coupled between the plurality of second page buffer low-voltage units and the plurality of second pads, and configured to electrically couple the plurality of second page buffer low-voltage units and the plurality of second pads in response to a second bit line sensing signal, wherein the first bit line sensing signal and the second bit line sensing signal are activated at different times, and wherein the plurality of first sensing transistors and the plurality of second sensing transistors are connected to the plurality of first pads through the plurality of second pads.

15. The memory device according to claim 14,
wherein a first sensing transistor and a second sensing transistor, which are coupled in common to each of the plurality of second pads, share a junction region, and
wherein each of the plurality of second pads is coupled to the junction region through a contact.

16. The memory device according to claim 14, wherein the plurality of first sensing transistors and the plurality of second sensing transistors are disposed in different rows.

17. The memory device according to claim 7, wherein the memory cell array comprises:
a plurality of electrode layers and a plurality of interlayer dielectric layers alternately stacked on a substrate; and
a plurality of vertical channels passing through the plurality of electrode layers and the plurality of interlayer dielectric layers, and coupled to the bit lines.

18. A memory device comprising:
a memory cell array including a drain select transistor; and
a page buffer circuit coupled to the memory cell array through a first bit line and a second bit line,
wherein the page buffer circuit comprises:
a bit line selection circuit provided in a cell wafer that includes the memory cell array and that has a first pad on one surface thereof, and that includes
a first select transistor coupled between the first bit line and the first pad, and configured to electrically couple the first bit line and the first pad in response to a first bit line select signal, and
a second select transistor coupled between the second bit line and the first pad, and configured to electrically couple the second bit line and the first pad in response to a second bit line select signal;
a page buffer low-voltage circuit, provided in a peripheral wafer that is bonded to the one surface of the cell wafer and has on one surface thereof bonded to the cell wafer a second pad coupled to the first pad, that includes a first page buffer low-voltage unit corresponding to the first bit line and a second page buffer low-voltage unit corresponding to the second bit line; and
a page buffer high-voltage circuit provided in the peripheral wafer, and configured to couple one of the first page buffer low-voltage unit and the second page buffer low-voltage unit to the second pad,
wherein the second pad is directly on the first pad, and
wherein both the first select transistor and the second select transistor are connected to the second pad through the first pad.

19. The memory device according to claim 18,
wherein a number of first pads is half of a number of first and second bit lines,
wherein a number of second pads is half of the number of first and second bit lines, and
wherein the first bit line select signal and the second bit line select signal are activated at different times.

20. The memory device according to claim 18,
wherein a number of first pads is half of a number of first and second bit lines,
wherein a number of second pads is half of the number of first and second bit lines,
wherein the page buffer high-voltage circuit comprises:
a first sensing transistor coupled between the second pad and the first page buffer low-voltage unit, and configured to electrically couple the second pad and the first page buffer low-voltage unit in response to a first bit line sensing signal; and
a second sensing transistor coupled between the second pad and the second page buffer low-voltage unit, and configured to electrically couple the second pad and the second page buffer low-voltage unit in response to a second bit line sensing signal,
wherein the first bit line sensing signal and the second bit line sensing signal are activated at different times, and
wherein both the first sensing transistor and the second sensing transistor are connected to the first pad through the second pad.

* * * * *